United States Patent
Long et al.

(10) Patent No.: US 7,776,156 B2
(45) Date of Patent: Aug. 17, 2010

(54) SIDE RF COIL AND SIDE HEATER FOR PLASMA PROCESSING APPARATUS

(75) Inventors: Maolin Long, Santa Clara, CA (US); David P. Sun, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 1056 days.

(21) Appl. No.: 11/055,191

(22) Filed: Feb. 10, 2005

(65) Prior Publication Data
US 2006/0174834 A1    Aug. 10, 2006

(51) Int. Cl.
*H01L 21/00* (2006.01)
*C23C 16/00* (2006.01)
*C23C 14/00* (2006.01)

(52) U.S. Cl. ............ 118/725; 118/723 I; 156/345.52
(58) Field of Classification Search ......... 118/715–733, 118/723 I; 156/345.1–55
See application file for complete search history.

(56) References Cited

U.S. PATENT DOCUMENTS

| | | | |
|---|---|---|---|
| 6,308,654 B1 * | 10/2001 | Schneider et al. | 118/723 I |
| 6,469,448 B2 | 10/2002 | Taguchi et al. | |
| 6,545,420 B1 | 4/2003 | Collins et al. | |
| 6,646,385 B2 * | 11/2003 | Howald et al. | 315/111.51 |
| 2002/0100557 A1 * | 8/2002 | Li et al. | 156/345.48 |
| 2005/0067157 A1 * | 3/2005 | Faybishenko et al. | 165/185 |

* cited by examiner

*Primary Examiner*—Ram N. Kackar
(74) *Attorney, Agent, or Firm*—Townsend and Townsend and Crew

(57) ABSTRACT

A RF plasma generation and temperature control system for an inductively coupled plasma process chamber. The plasma generation system includes a heater that includes an elongated upper heating element substantially parallel to an elongated lower heating element, where the upper and lower heating elements are joined by one or more posts substantially perpendicular to the upper and lower heating elements. The system also including one or more RF coils featuring a crease at points of overlap with the posts. Also, a RF plasma generation system for an inductively coupled plasma process chamber, where the plasma generation system includes a heater thermally coupled to the chamber, and one or more RF coils coupled to the chamber, where the RF coils include a hollow tube having at least one flat side.

27 Claims, 14 Drawing Sheets

Section A-A

Section B-B

Section C-C

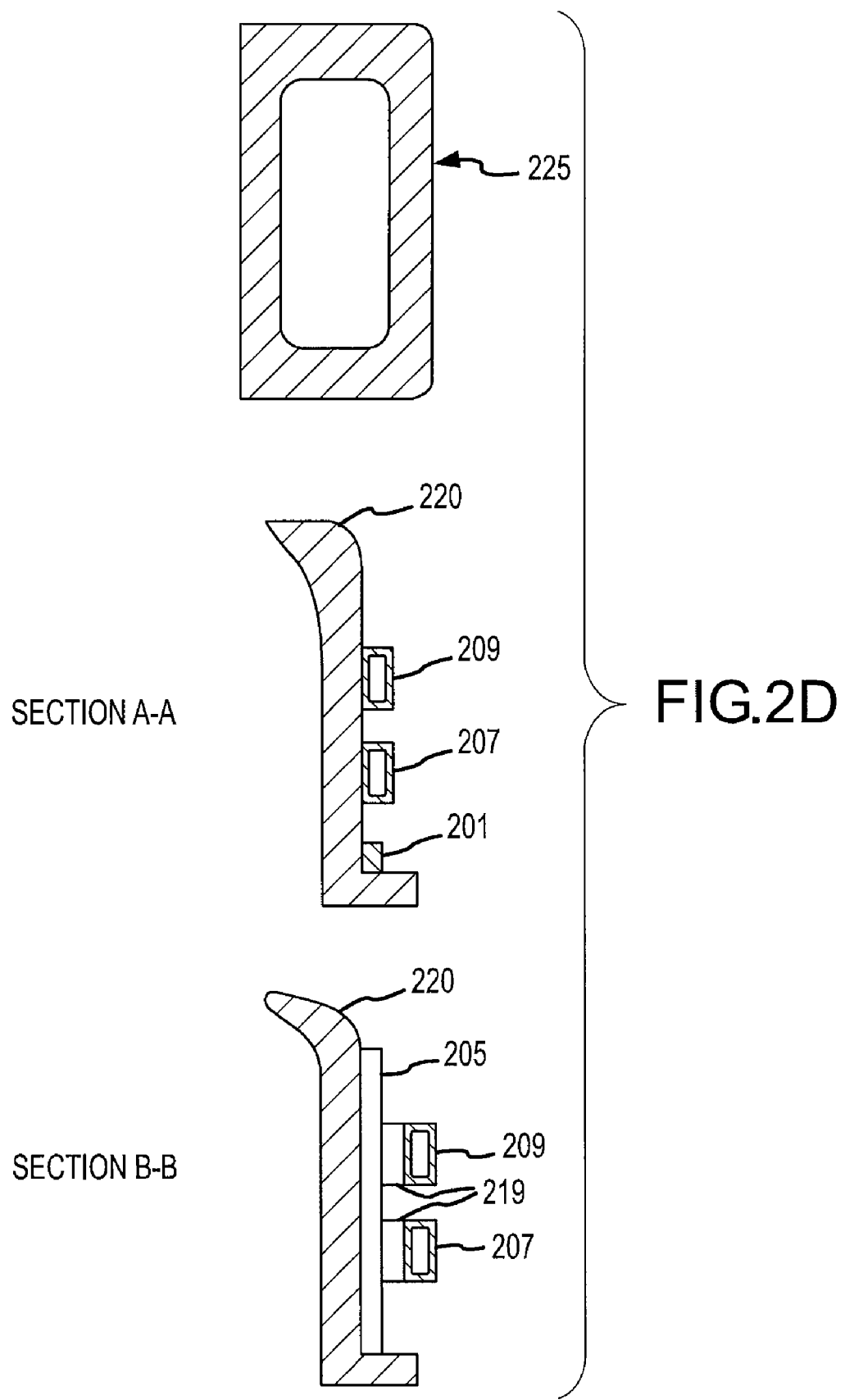

SIDE RF COIL AND SIDE HEATER FOR PLASMA PROCESSING APPARATUS

BACKGROUND OF THE INVENTION

Several methods for fabricating semiconductor devices utilize a plasma generated or maintained within a processing chamber. The character of the plasma within the chamber has an important effect upon the results of the fabrication process, such as etching or chemical vapor deposition.

For example, the quality of the plasma generated may be characterized by uniformity, plasma potential, and electron temperature among other characteristics. One kind of plasma reactor of interest is the inductively coupled plasma reactor. The plasma in such a reactor is generated inside a vacuum chamber by RF coils (also referred to as antenna), typically located on the top of the dome and/or around the outer side wall of the dome.

By adjusting the RF current in the coil, the density of the ions can be controlled. The energy of the ions can be controlled by another RF power, usually called RF bias, that is connected to the wafer pedestal. However, ion energy is not mono-energetic, and ion energy distribution is dependent on many factors, including but not limited to bias power and frequency, ion species, and plasma density.

One factor affecting the quality of the process on the wafer is fluctuation in dome temperature. Fluctuation in dome temperature may generate particles that deposit on the wafer and cause a lack of repeatability of a deposited film of material. In addition, variation in temperature over regions of the dome may result in excessive thermal stress that can ultimately result in dome fracture.

Another issue faced by the designers of plasma generation chambers is capacitive coupling between the RF coil and the ions of the plasma. Increased capacitive coupling between the coil and the plasma can give rise to an elevated plasma potential in the proximity of the dome surface, thereby increasing the energy of the ions impinging on the dome surface. High ion energies give rise to excessive ion bombardment on the dome wall adjacent to the RF coil, thereby increasing the number of contaminant particles and the temperature of the ceramic dome.

A number of techniques can be employed alone or in conjunction to reduce capacitive coupling. In one approach, a Faraday shield can be placed between the RF coils and the generated plasma. The Faraday shield is a grounded conductive layer that includes narrow, elongated openings having a major axis perpendicular to the windings of the RF coils. These openings allow magnetic flux entering the chamber to generate and sustain plasma, and act to suppress any eddy currents that would otherwise tend to be induced in the Faraday shield. The conductive and electrically grounded plane of the Faraday shield reduces capacitive coupling from high RF voltage in the coil to the plasma.

Given the importance of plasma-based processes to the fabrication of semiconductor devices, methods and structures permitting enhanced durability and reliability of plasma-based fabrication apparatuses are desirable.

SUMMARY OF THE INVENTION

Embodiments of the invention include a RF plasma generation and temperature control system for an inductively coupled plasma process chamber. The plasma generation system includes a heater that includes an elongated upper heating element substantially parallel to an elongated lower heating element, where the upper and lower heating elements are joined by one or more posts substantially perpendicular to the upper and lower heating elements. The system also includes one or more RF coils featuring creases at points of overlap with the posts.

Embodiments of the invention also include a RF plasma generation and temperature control system for an inductively coupled plasma process chamber. The plasma generation system includes a heater thermally coupled to the chamber, and one or more RF coils coupled to the chamber, where the RF coils include a hollow tube having at least one flat side.

Embodiments of the invention further include a plasma chemical vapor deposition system to process a substrate. The system includes a chamber having a dome that defines an upper boundary for a plasma processing region, where a lower boundary for the processing region is defined by an upper surface of the substrate. The system also includes a heater attached to a side portion of the dome. The heater includes an elongated upper heating element substantially parallel to an elongated lower heating element, where the upper and lower heating elements are joined by one or more posts substantially perpendicular to the upper and lower heating elements. The system may also include a source plasma system having a top coil coupled to a top of the dome, and a side coil having at least one RF coil positioned between the upper and lower heating elements and featuring a crease at points of overlap with the posts.

Embodiments of the invention further include a method of controlling a temperature of a plasma chamber. The method may include the step of disposing, adjacent to a chamber sidewall, a heater that includes an elongated first heating element substantially parallel to an elongated second heating element. The first and second heating elements may be joined by one or more posts substantially perpendicular to the heating elements. The method also includes the step of disposing a cooling element adjacent to the chamber sidewall between the first heating element and the second heating element. The cooling element may include a crease at points of overlap with the posts, such that the cooling element and the first and second heating elements avoid physical contact and maximize thermal interaction with the chamber.

A further understanding of embodiments in accordance with the present invention can be made by way of reference to the ensuring detailed description taken in conjunction with the accompanying drawings.

BRIEF DESCRIPTION OF THE DRAWINGS

FIG. 2D shows cross-sectional views of a RF coil, and the RF side coil and heater system taken at the two points shown in FIG. 2C;

DESCRIPTION OF THE SPECIFIC EMBODIMENTS

Figure 1A:
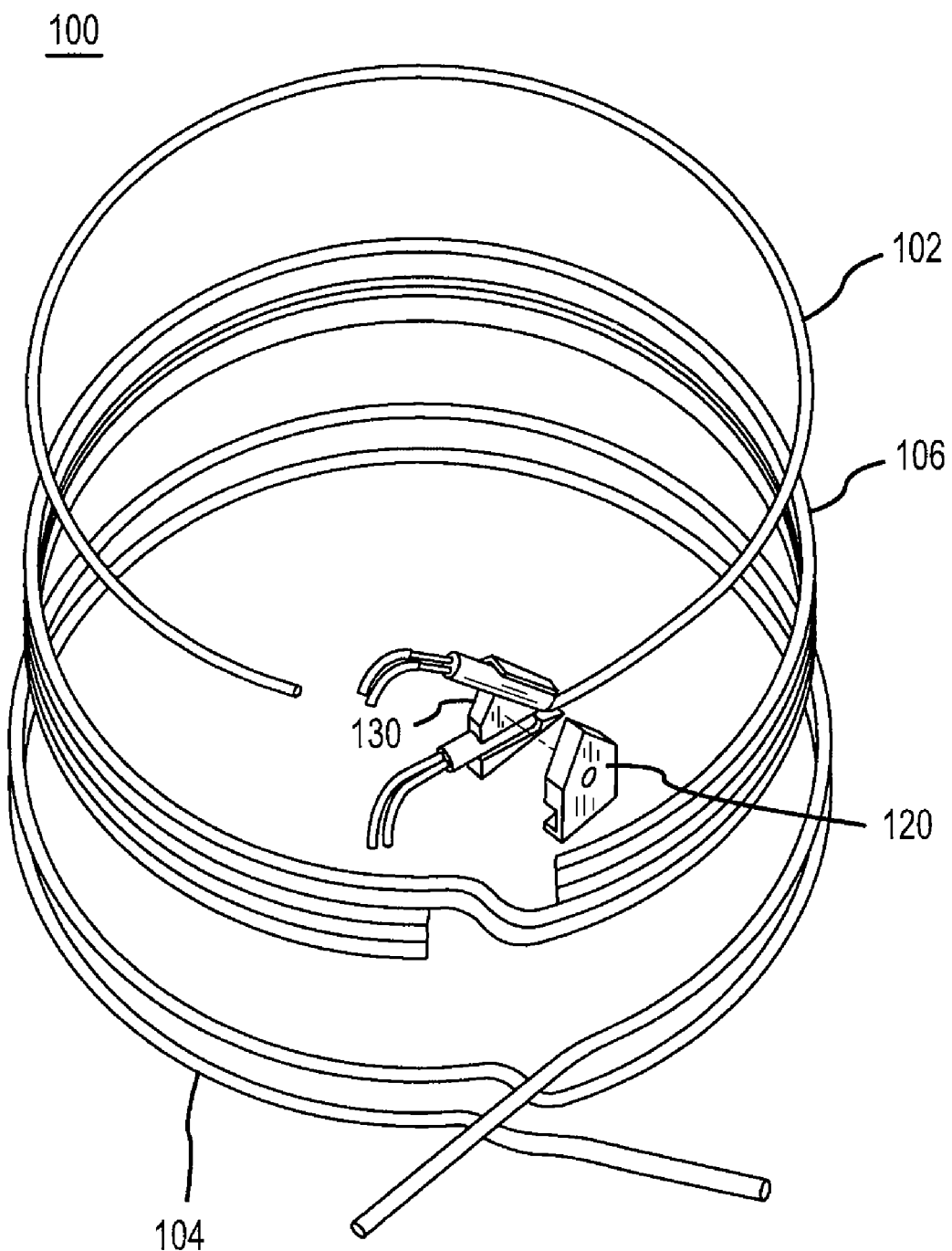
FIG. 1A is an expanded view of a conventional RF side coil and heater assembly.
Figure 1B:
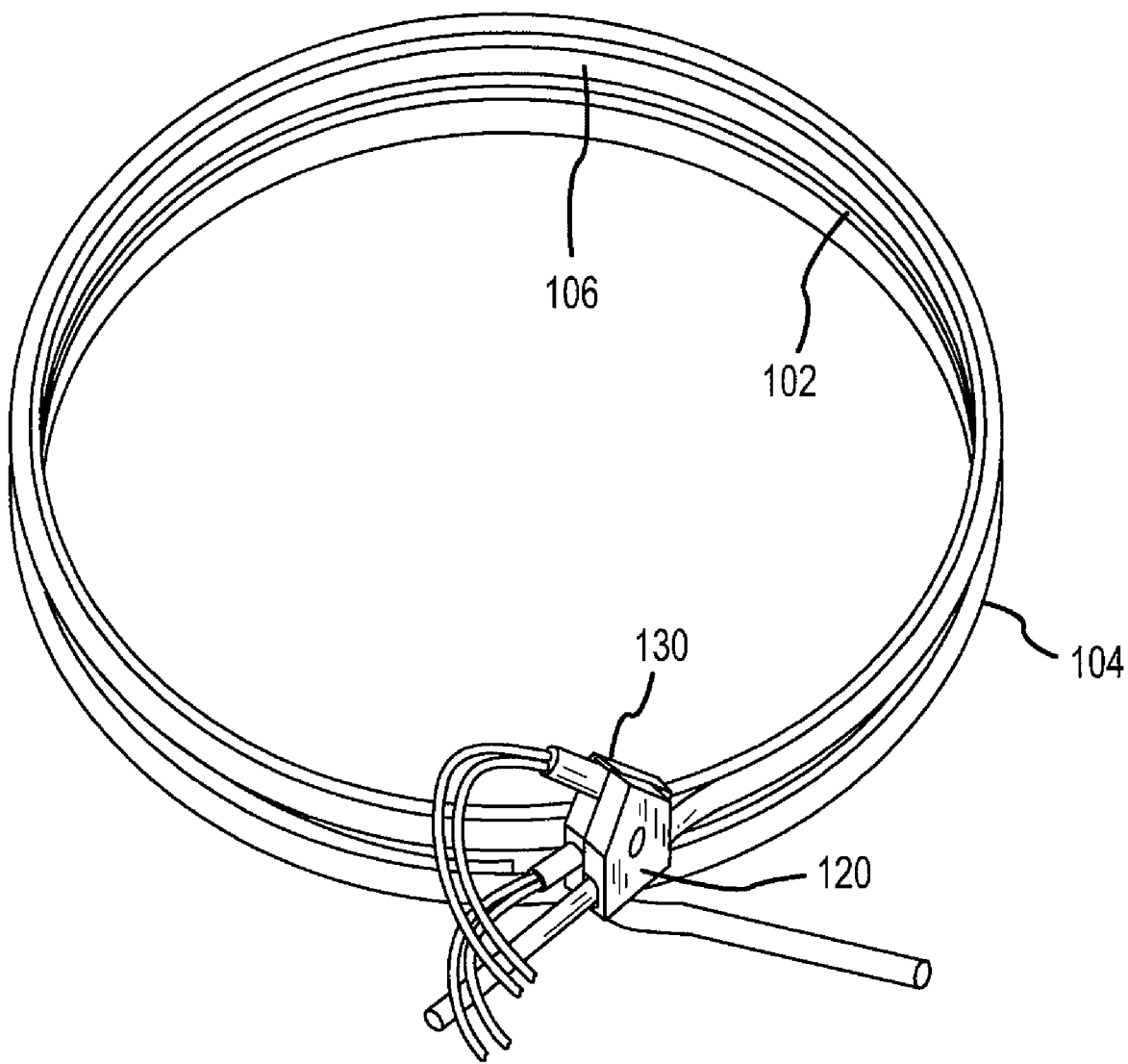
FIG. 1B is an assembled view of the conventional RF side coil and heater assembly.

FIGS. 1A and 1B show expanded and assembled views of a conventional side RF coil and heater assembly 100. The assembly has heater 102 and RF coil 104 concentrically aligned and coupled by frame 106. The heater 102, RF coil 104 and frame 106 may also be coupled by interconnect 120 and assembly 130.

Figure 1C:
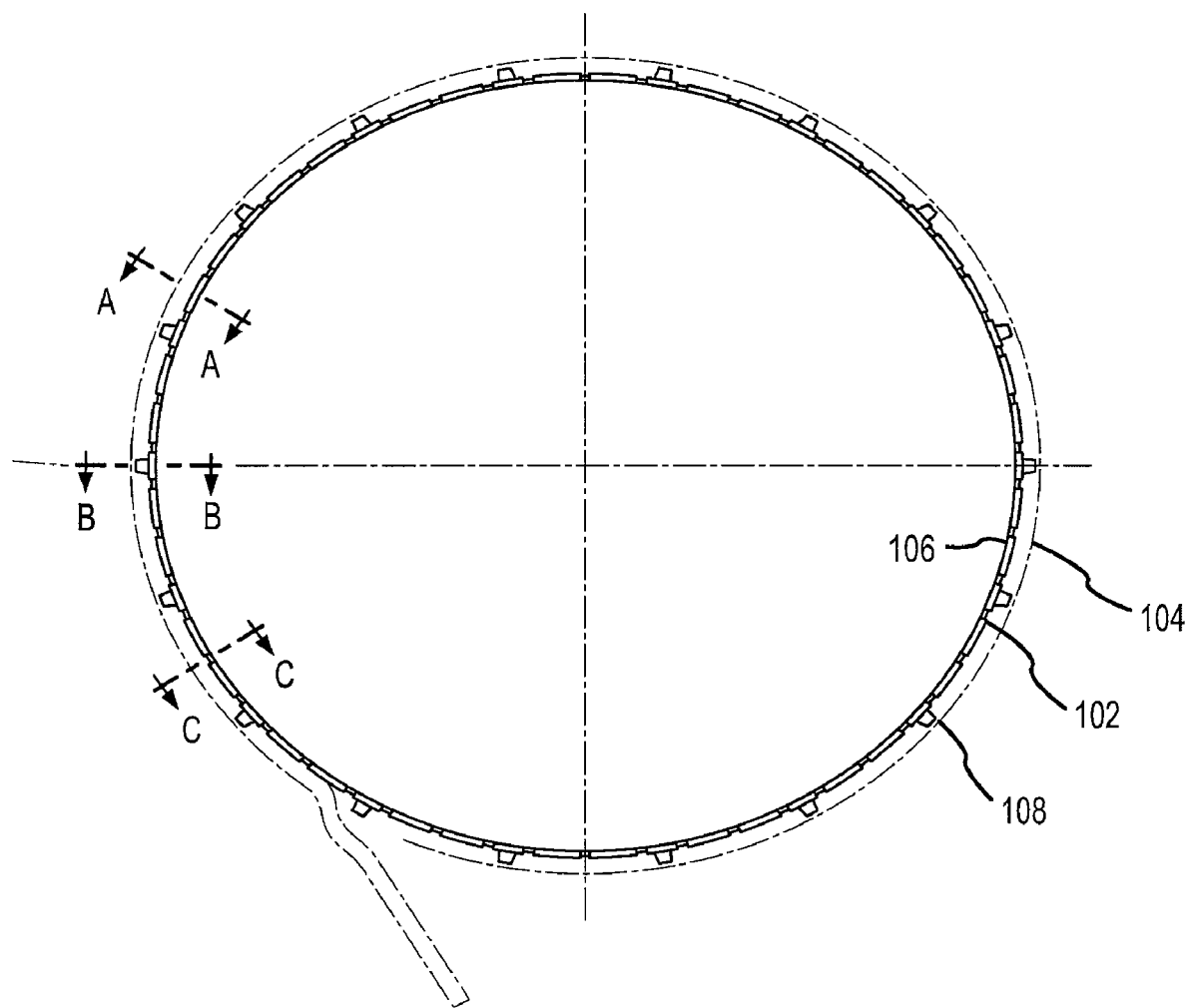
FIG. 1C is a plan view of the conventional RF side coil and heater assembly.

FIG. 1C shows a plan view of the conventional side RF coil and heater assembly 100. This view shows the concentric and coplanar alignment of the heater 102 and RF coil 104. The RF coil 104 may be held in position relative to the heater 102 by frame 106, which has tabs 108 that extend out and support the windings of the RF coil 104. The assembly 100 may be positioned around the outside of a dome sidewall (not shown) that helps defines the plasma generation space of a plasma chamber. In this configuration, the heater 102 is positioned closer to the dome sidewall than RF coil 104. The heater 102 will also be cooled with the dome sidewall when RF coil 104 circulates cooling fluid to cool the plasma chamber.

Figure 1D:
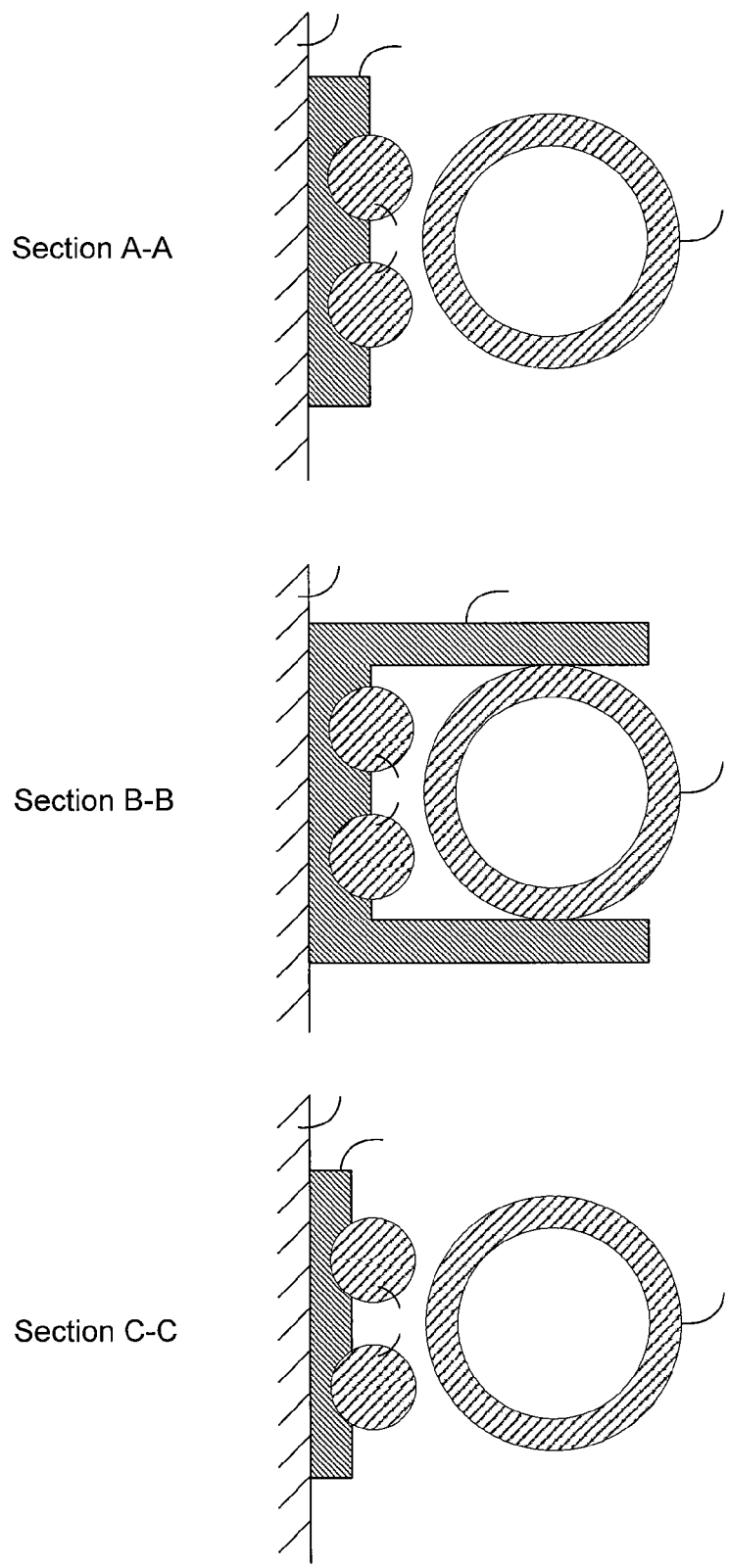
FIG. 1D shows cross-sectional views of the conventional RF side coil and heater assembly taken at the three points shown in FIG. 1C.

FIG. 1D further illustrates the positions of the dome sidewall 110 relative to the heater 102 and RF coil 104. Section A-A shows a cross-sectional view of one turn of the assembly 100 at line A in FIG. 1C. Section B-B shows another cross-sectional view of assembly 100 at line B in FIG. 1C, where tab 108 extending from frame 106 is contacting RF coil 104. Section C-C shows still another cross-sectional view of the assembly 100 at line C. In Section C-C, frame 106 may be shorter and thinner than the comparable portion of frame 106 in Section A-A.

Figure 1E:
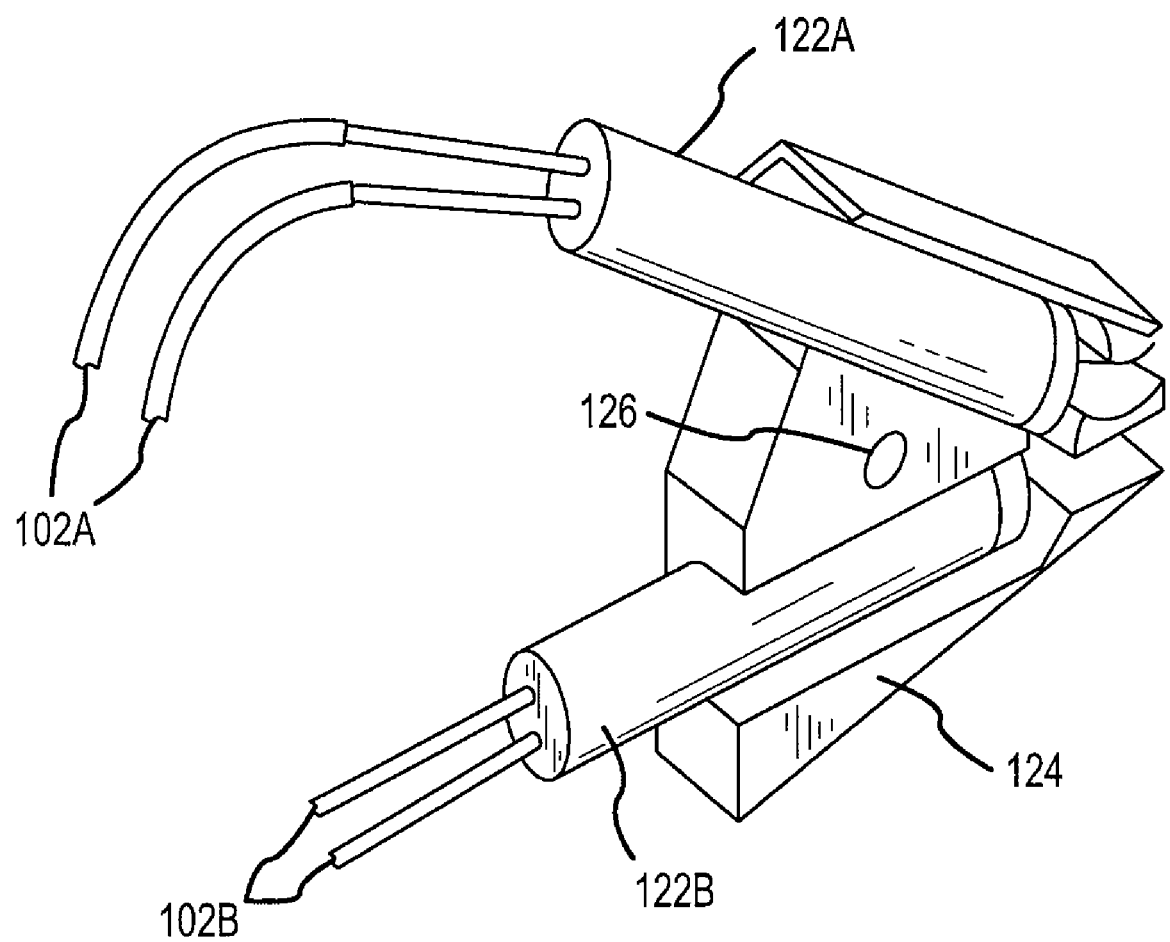
FIG. 1E is a three dimensional view showing the electrical connections of the heater in the conventional RF coil and heater assembly.

FIG. 1E shows a three dimensional view of the assembly 130 in FIGS. 1A and 1B. The assembly 130 includes conduits 122A and 122B for connection an AC power source (not shown). In the embodiment shown, heater 102 comprises two pairs of wires with a first pair 102A located close to conduit 122A and a second pair 102B emerging from conduit 122B. A power supply input (not shown) is connected to the first and second pairs 102A and 102B through a closed-loop temperature controller to regulate the temperature of the side wall of the ceramic dome. The conduits 122A and 122B may be held in place by electrical bracket 124, which may be secured to the rest of assembly 100 by a fastener (not shown) accepted at opening 126.

While the conventional side RF coil and heater assembly of FIGS. 1A-E is suitable for performing plasma processing in a chamber, a number of improvements are possible. For example, forces of thermal expansion and contraction created by operation of the heater 102 may be transmitted to the frame. In some instances, for example when the magnitude of the forces is large and/or after the thermal expansion and contraction repeat too many times, metal fatigue and coil cracking may result.

In addition, the coincident physical position and close physical contact between the heating element and the cooling element (e.g., hollow RF coil) reduce both heating and cooling efficiency for the ceramic dome, meaning that either the temperature regulation response is slow or the dome temperature cannot be regulated to its setpoint in a given period of time.

Figure 2A:
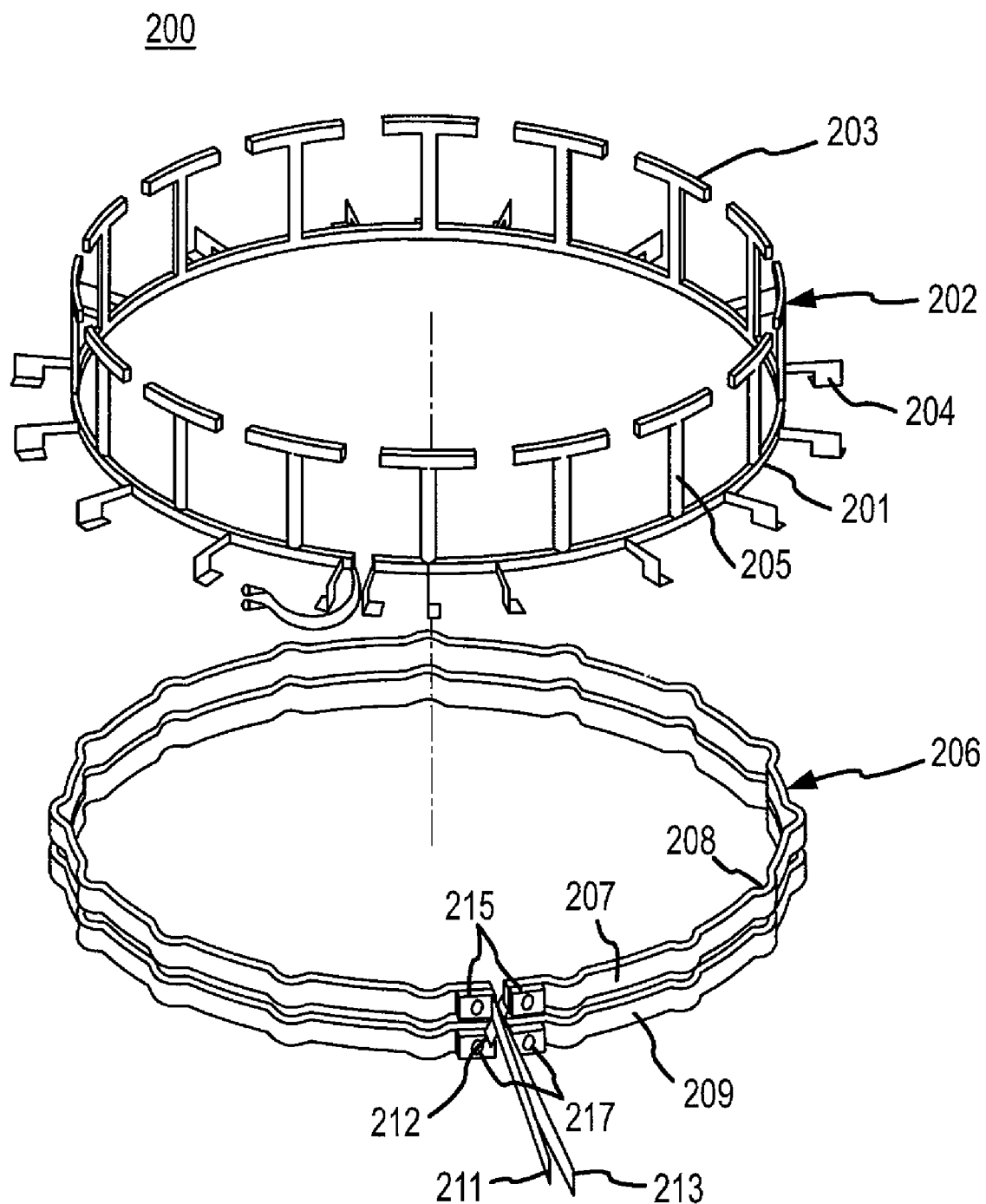
FIG. 2A is an expanded view of a RF side coil and heater system according to embodiments of the invention.

Accordingly, FIG. 2A shows an expanded view of a RF side coil and heater system 200 according to embodiments of the invention. System 200 includes a heater 202 and side RF coil 206. The heater includes a pair of elongated heater segments 201 and 203 of conductive material oriented along the circumference of the chamber and substantially parallel to one another. The two heater elements are joined by posts 205 that are substantially perpendicular to the parallel, elongated heating elements 201 and 203. The posts 205 may have a chamber side facing radially inward towards the plasma chamber (not shown) and an opposite side (i.e., the coil side) that faces radially outward towards the RF coil 206.

In the embodiment shown, side RF coil 206 includes two turns 207, 209 positioned between heating elements 201 and 203 and exhibiting creases 208 at points where the posts crossover the turns 207, 209. Creases 208 allow the RF coil 206 to create additional space to accommodate the posts 205. In certain embodiments, a dielectric (e.g., ceramic or Vespel) spacer provides electrical isolation between the heater posts 205 and the overlapping coil.

The creases 208 allow the non-creased portions of the RF coil 206 to be closer to the walls of the plasma chamber (not shown). The close proximity of the coil 206 to the walls permit a faster and more focused cooling of the chamber by the cooling fluid circulating through the coil 206. In some embodiments, the non-creased portions of the coil 206 may physically contact the dome sidewall of the plasma chamber. These non-creased coil portions avoid physical contact with the heater 202 to ensure maximum thermal interaction and cooling of the dome sidewall.

The turns 207, 209 of RF coil 206 may be electronically coupled through inter-turn connection 212. In this configuration, a RF power supply (not shown) is coupled to RF feed input 211 that is electrically coupled to one end of top turn 207. Electric power follows a path from the input end of top turn 207 until reaching the output end, where it crosses to the bottom turn 209 via the inter-turn connection 212. The path then goes from the starting end of the bottom turn 209 to the bottom output end, which is electrically coupled to the RF feed output 213. The RF feed output 213 may be coupled to a return terminal on the RF power supply (not shown), or a ground node.

The inter-turn connection 212 may be made from a flexible conductive material that allows the first and second turns 207 and 209 to expand and contract according to changing temperature without causing undue stress on the coils. This reduces metal fatigue that can lead to cracks in the coil 206.

The turns 207, 209 may also include ports 215, 217 for the circulation of cooling fluid, allowing the coils to also act as a means for cooling the ceramic dome. The ports 215, 217 each include an inlet and outlet for the cooling fluid. The inlets may be connected to fluid supply conduit (not shown), while the outlets may be connected to fluid return conduit (not shown). The cooling fluid is typically de-ionized water, although other cooling fluids may be used as well. The cooling fluid may enter the coils 207, 209 at room temperature (e.g., about 19° C. to about 23° C.) and exit the coils at, for example, about 50° C. to about 60° C.

As noted above, a substantial portion of the RF coil 206 may be in direct physical contact with the sidewall of the ceramic dome, which allows faster and more efficient chamber cooling by using real-time/online flow rate control of cooling fluid (e.g., the flow rate of the cooling fluid is reduced during dome heating while the flow rate of the cooling fluid is increased during dome cooling).

The heater 202 includes a lower portion 201, an upper portion 203, and a plurality of perpendicular posts 205. In the embodiment shown in FIG. 2A, the lower heating element 201 has a single break that creates a first and second end in the element 201. This way, the metal housing of the heater assembly 202 does not form a closed loop and the connections for the AC power source can run from one end of the housing if the internal heating element is arranged in a U-turn shape in the housing. The heat is generated by the AC current flowing in the heating element inside the housing of the heater, where the heating element may be made of tungsten wire that may be electrically isolated from its metal housing by a dielectric layer between the tungsten wire and the metal housing.

The lower element 201 may be electrically coupled to one or more grounding tabs 204, which provide a path to electrically ground the heater 202. The grounding tabs 204 may be attached to a portion of the grounded chamber (not shown) such as the chamber lid, or some other conductor to ground. Alternatively, no grounding tabs 204 may be connected to the lower element 201, allowing heater 202 to electrically float.

The upper element 203 may be divided into a plurality of spaced apart, upper element segments. Dividing the element into multiple segments further reduces the amount of inductive current generated in the element 203 by the RF power emitted by the RF coils (not shown). The element 203 may be divided into 2 or more upper element segments (e.g., 2 to 50 segments), with each upper element segment coupled to the lower element 201 by a perpendicular post 205.

Figure 2B:
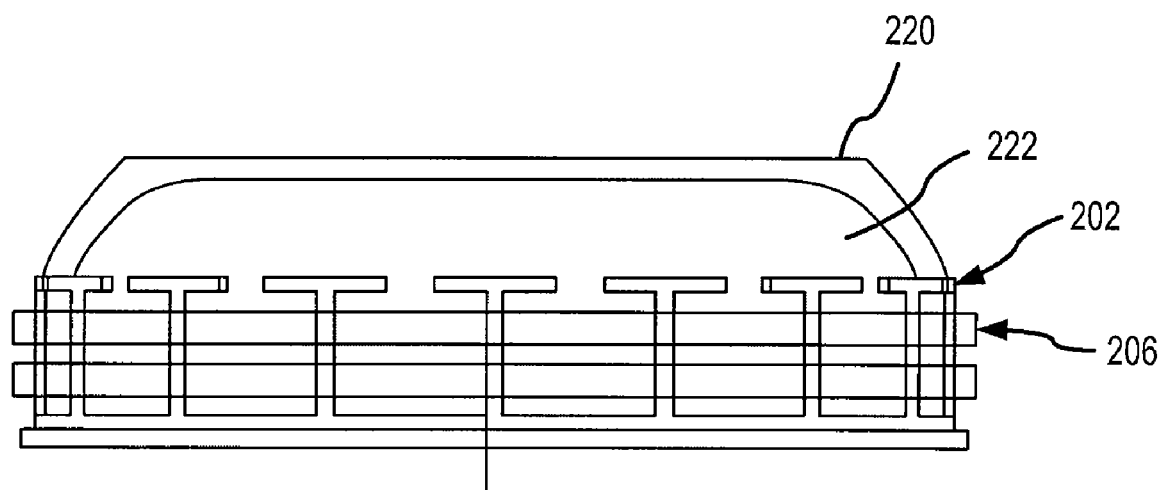
FIG. 2B is an assembled, side view of a RF side coil and heater system according to embodiments of the invention.

FIG. 2B shows an assembled, side view of a RF side coil and heater system 200 according to embodiments of the invention. This view shows the orientation of the heater 202 and RF generator 206 around the sidewall of dome 220 which helps define an upper region of plasma chamber interior 222. The surface area of the heating elements 201, 203 and posts 205 in direct contact with dome sidewall 220 is generally less than for conventional heaters (e.g., about 0.6 times or less than the direct contact surface area for conventional heaters). The coils 207, 209 of the RF generator 206 are positioned between the lower and upper heater elements 201, 203. Since the heating elements 201, 203 are not radially coplanar with the RF coils 207, 209 the amount of inductive current generated in the elements 201, 203 by RF power emitted by the coils 207, 209 is reduced.

Figure 2C:
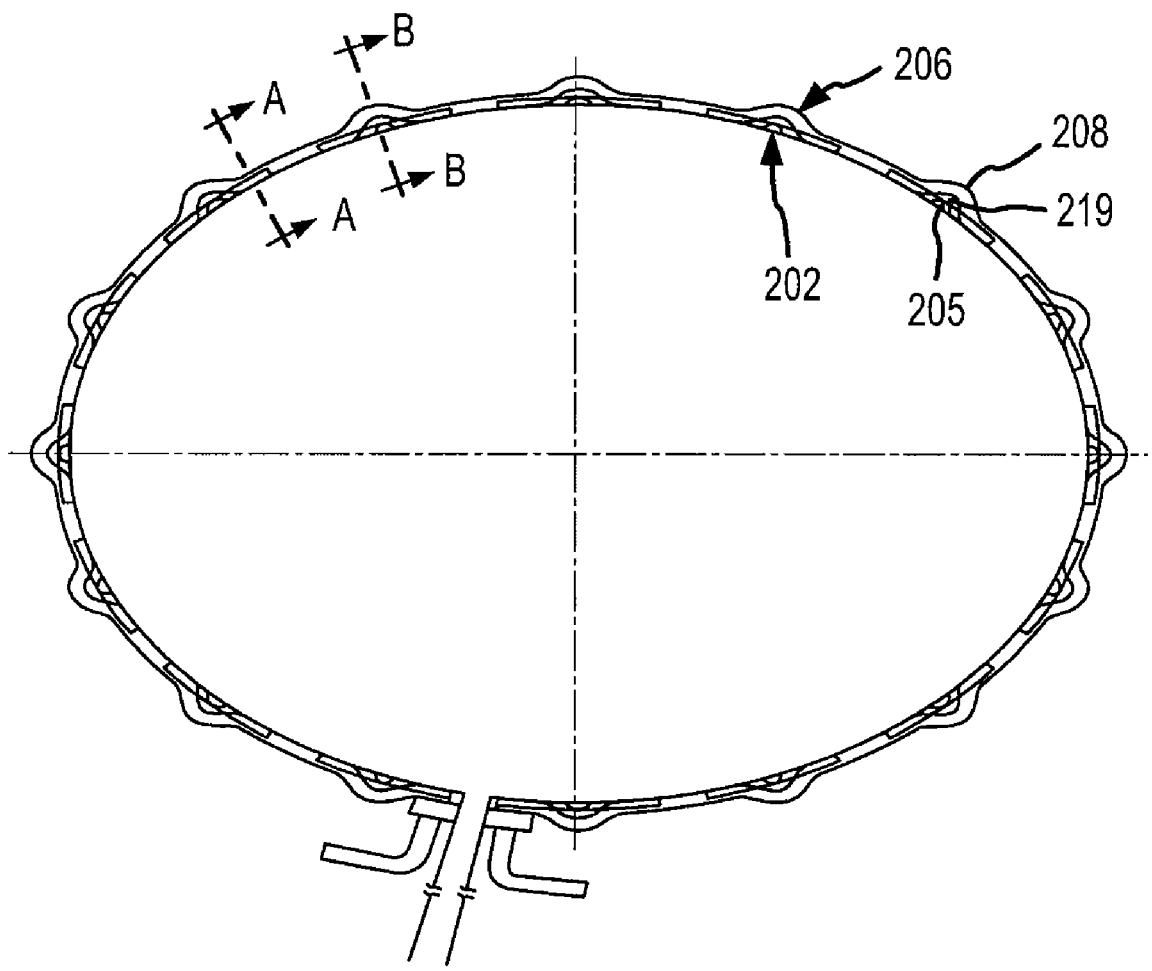
FIG. 2C is a plan view of a RF side coil and heater system according to embodiments of the invention.

FIG. 2C shows a plan view of a RF side coil and heater system 200. The gap 219 created between crease 208 in the turns 207, 209 and the post 205 of the heater 202 may be filled with an elastomeric material or, alternatively, an energy absorbing plastic (e.g., a polymer such as VESPEL®) that couples the heater 202 and RF generator 206 together. The material can deform as the heater 202 undergoes thermal expansions and contractions, reducing the stress and fatigue on the nearby coil turns 207, 209.

FIG. 2D shows cross-section of an exemplary RF coil 225 according to embodiments of the invention. RF coil 225 has at least one substantially flat side. Specifically, coil 225 is rectangularly shaped and includes flat surfaces on four sides, where one of those sides faces a heater post and the plasma generating chamber. Other embodiments include coils that are "D"-shaped (not-shown) and include a flat side facing the post and the chamber, while a curved side faces in the opposite direction. The inner cross-sectional area of coils with at least one flat side is generally larger than the inner cross-sectional area of a cylindrical tube (e.g., at least about 1.5 times the cross-sectional area of the cylindrical tube).

The flat surface of coil 225 provides a more unidirectional emission of RF power from the surface, which increases the amount of RF power directed into the plasma generating region of the chamber and reduces the RF power running parallel to the sidewalls of the chamber. The more unidirectional emission of the RF power makes the plasma generation system more efficient (i.e., requiring less RF power to generate the same plasma density, or allowing a higher density to be generated from the same about of RF power) and provides a plasma density profile having an improved center-high and edge-low profile, providing a more consistent center-to-edge gapfill result. Also, the more unidirectional power reduces the sidewall heating, plasma misdirection, and plasma arcing caused by the RF power component that runs parallel to the dome sidewalls in the plasma chamber.

FIG. 2D also shows cross-sectional views of the RF side coil and heater system 200 taken at lines A and B in FIG. 2C. Cross-section A-A shows a flat surface of coils 207, 209 in direct contact with the sidewall of dome 220. The average RF coupling distance from the coils 207, 209 to the dome 220 is typically shorter than in conventional side RF assemblies (e.g., about 0.85 times or less than the RF coupling distance for conventional side RF assemblies). The coils 207, 209 are also positioned above lower heating element 201. The upper heating element is not shown at section A-A, which intersects a gap between the segments of the upper heating element. Cross-section B-B, taken at the apex of a crease 208 in the coils 207, 209, shows the flat surface of coils 207, 209 coupled to post 205 by an elastomeric material or energy absorbing plastic that fills space 219. The elastic material may stretch and compress as the thermal expansions and contractions of the heater and RF generator cause the post 205 and coils 207, 209 to push and pull on each other.

Figure 3A:
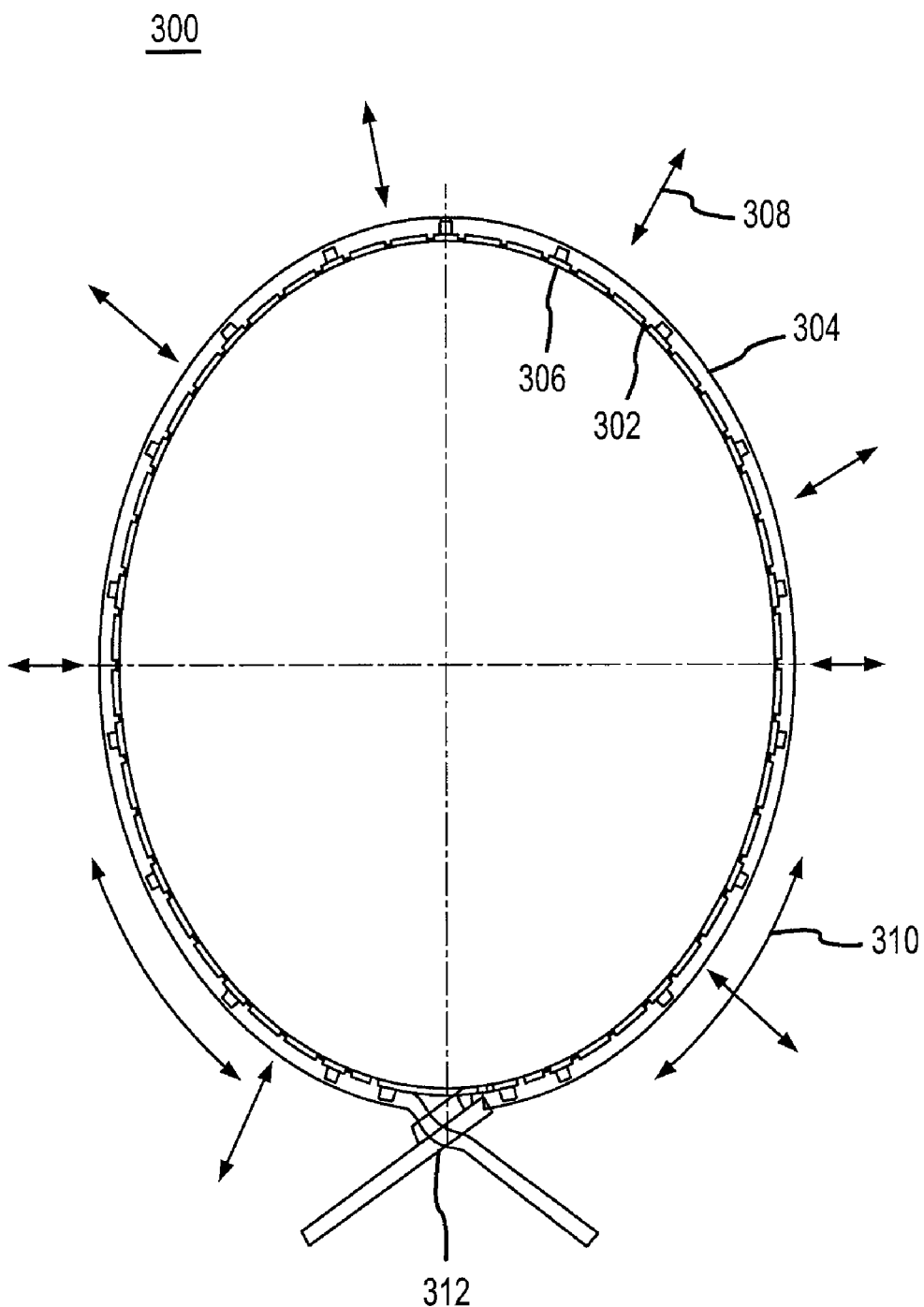
FIG. 3A is a plan view of a conventional RF coil and heater assembly that shows the direction of motion caused by the thermal expansions and contractions of the assembly.
Figure 3B:
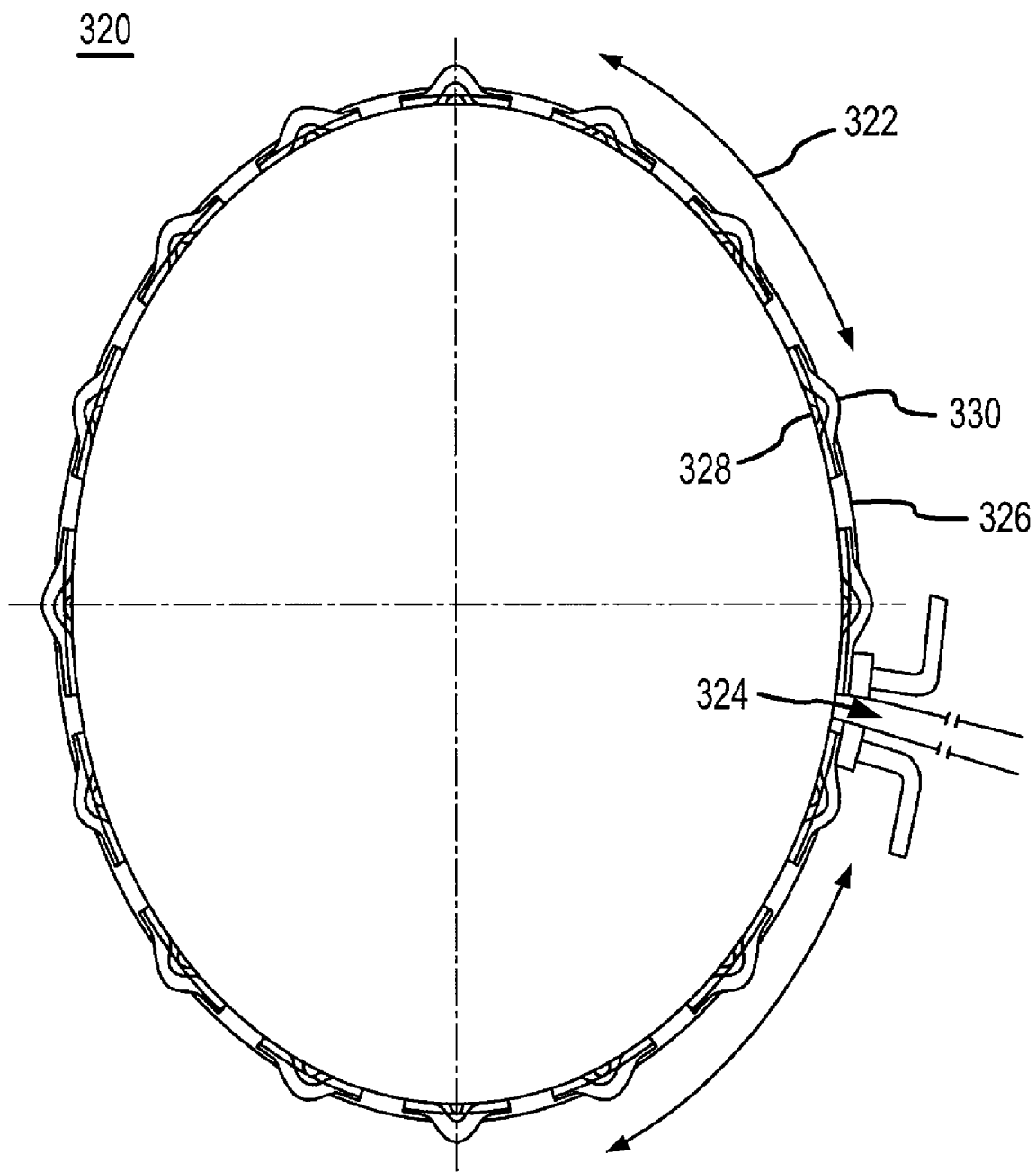
FIG. 3B is a plan view of a RF coil and heater system according to embodiments of the invention that shows the direction of motion caused by the thermal expansions and contractions of the system.

FIGS. 3A and 3B show plan views of the motions caused by thermal expansions and contractions in a conventional RF coil and heater assembly 300, and a RF coil and heater system according to embodiments of the invention. FIG. 3A shows that the thermal changes caused by the heater and bracket 302, 306 exert radially directed forces 308 on the coils of RF generator 304. FIG. 3A also shows how the thermal expansions and contractions can create tangential forces 310 directed along the circumference of the circular assembly. The tangential forces 310 can cause stress in the interconnect region 312 and may fracture the dome.

By contrast, FIG. 3B shows forces created by thermal expansions and contractions of system 320 according to embodiments of the invention. These expansions and contractions create tangential forces 322 that are readily accommodated by the presence of the creases. Stress arising at the ends of RF coils 326 coupled in the interconnect region 324 may be alleviated by forming the connection from a flexible conductive material that allows the coil ends to move without placing undue stress on the coils 326. This can reduce fatigue and stress cracking in the coils 326 caused by the thermal expansions and contractions.

In system 320, the elastic coupling between heater 328 and RF coils 326 reduces the strain on the RF coils 326 caused by the thermal expansion of the heater 328 when in operation. Radially directed forces (not shown) generated by the expansion of heater 328 press against the elastomeric material or energy absorbing plastic in the creases 330. These materials absorb a least a portion of the strain caused by the moving heater 328. Since at least a portion of the strain is transferred away from the RF coils 326 by the material in the creases, there may not enough remaining force to move the RF coils 326 a significant distance, reducing fatigue and cracking in the coils.

Figure 4:
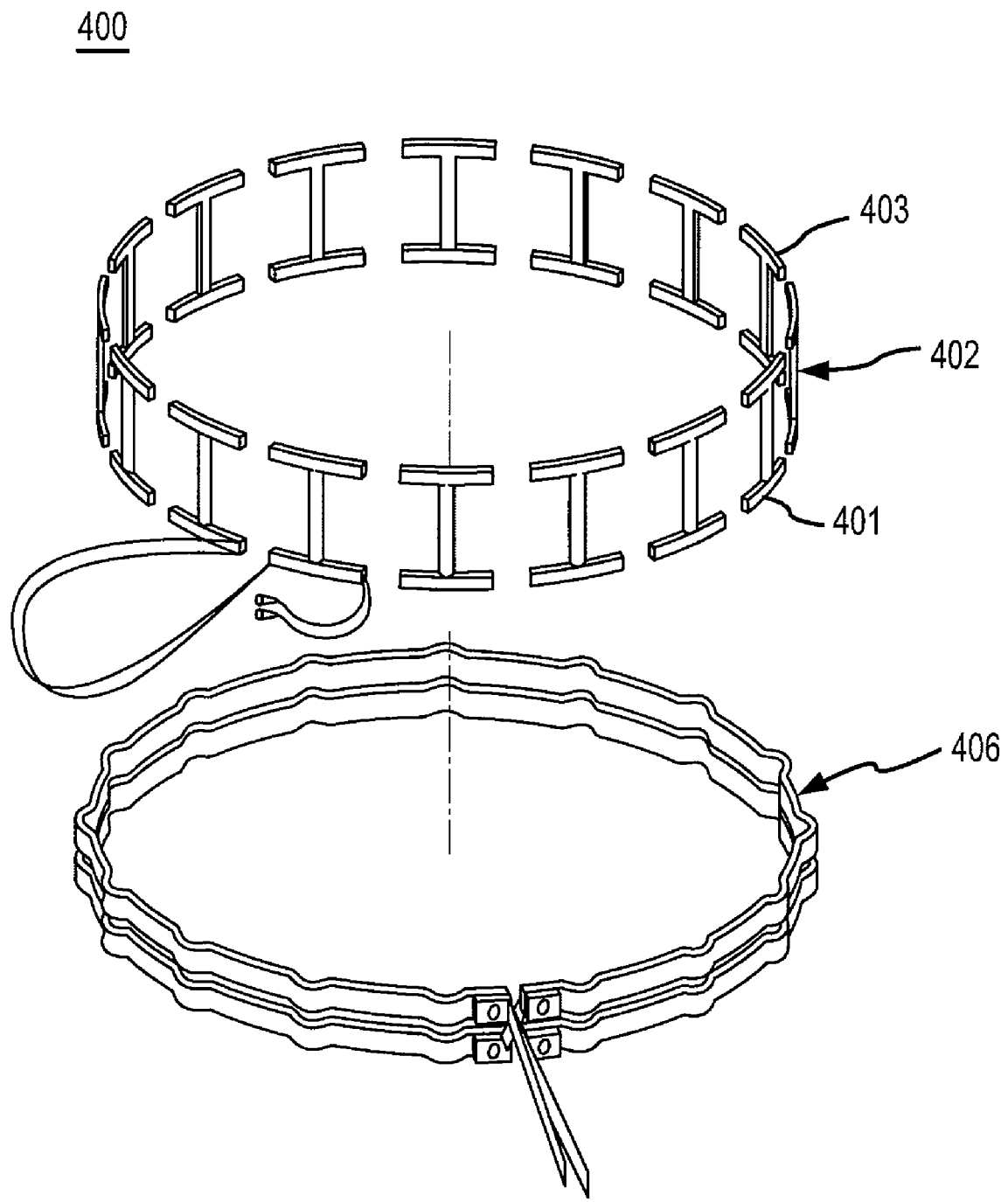
FIG. 4 is an expanded view of a RF side coil and heater system according to additional embodiments of the invention.

FIG. 4 shows an expanded view of a RF side coil and heater system 400 according to additional embodiments of the invention. The heater 402 in system 400 has both the lower heating element 401 and the upper heating element 403 divided into a plurality of heating element segments. Dividing both heating elements 401, 403 into multiple segments further reduces the amount of unwanted inductive current generated in the elements by the RF power emitted by the RF coils (not shown).

Conductors (e.g., wires) may electrically couple adjacent ends of element segments to form a circuit through the heating elements 401, 403. A power supply may be electrically coupled to an end of one of the element segments and a power return terminal (or ground) may be connected to an end of an adjacent element segment. The heater 402 may be grounded or electrically floating. The system 400 also includes a RF generator 406 positioned between the heating elements 401, 403.

Plasma generation systems of the invention may optionally include Faraday shields to decrease the steady state electrostatic field in the plasma chamber. For the instant invention, heaters 202 and 402 may be grounded to form a "single" Faraday shield that includes a cylindrical array of grounded spaced, axially extending posts or bars, etc., surrounding the dome walls and RF coils. A grounded heater acting as a Faraday shield (i.e., E-Shield) reduces the capacitive RF coupling of the side coil into the plasma.

Such reduced capacitive coupling decreases plasma potential, which reduces the possibility of plasma-induced wafer damage and the probability of micro chamber arcing. It also reduces uncontrollable biasing effects by side coil's capacitive coupling and leaves more control to the RF bias at substrate chuck. The reduced capacitive coupling may also decrease the intensity of the bombardment on the inner side wall of the dome, and thus indirectly decrease the side temperature on the dome.

Without the shield, the varying voltage along the RF coils would couple to the plasma in accordance with Maxwell's equations for capacitive displacement current coupling. This may induce non-uniformities and gradients in the plasma density and in the energy across the substrate and result in process non-uniformity and high energy charged particles. Faraday's Law expressed in integral form requires that a changing magnetic field through a surface results in closed electric fields in that surface. Maxwell's equations that describe the phenomenon in differential form specify that the curl of the induced electric field is proportional to the negative time rate of change of the magnetic field. For sinusoidal excitation, the curl of the induced E is proportional to the radiant frequency of the changing B field as well as its peak amplitude.

In short, a discontinuous or slitted or sectioned Faraday shield minimizes the shorting effect of the shield on the changing em field from the coil, reduces eddy current losses, and allows coupling of the radio frequency, axially directed fringing magnetic field to the plasma for inducing closed loop electric fields which generate the plasma, but precludes direct coupling of the electric field (which varies along the coils) to the plasma and, thereby, precludes any associated loss of plasma uniformity and process uniformity for high energy charged particles.

Embodiments of the invention also provide "full" Faraday shields that include a pair of concentric shields spaced so that the posts of one shield overlap the gaps of the other and vice versa. The overlap of the posts precludes line of sight paths for the electric field lines through the shield and thereby shunts the electrostatic field. Additional examples of Faraday shields may be found in co-assigned U.S. Pat. No. 6,545,420, filed Jun. 6, 1995, and titled "Plasma Reactor Using Inductive RF Coupling, and Processes", the entire contents of which are hereby incorporated for all purposes.

Exemplary Plasma Chemical Vapor Deposition System

Configurations like the one shown in FIGS. 2A-D and FIG. 4 may be used in a wide variety of plasma CVD systems, including, for example, HDPCVD systems for depositions on 200 mm and 300 mm substrates. Embodiments of these plasma CVD systems will now be described in more detail.

Figure 5A:
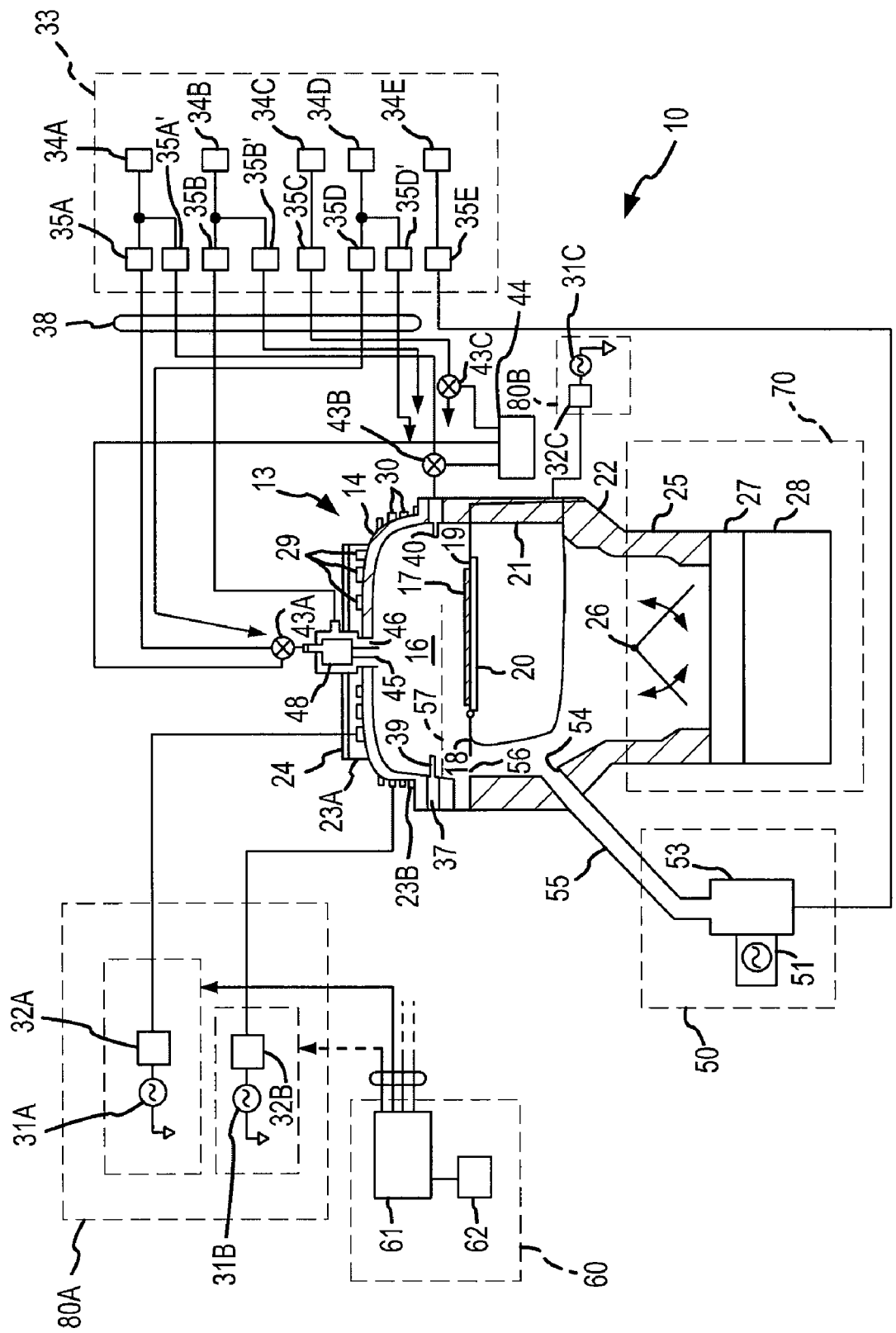
FIGS. 5A and 5B are vertical, cross-sectional views of a plasma chemical vapor deposition system in accordance with embodiments of the present invention.

FIG. 5A illustrates an embodiment of a high density plasma chemical vapor deposition (HDP-CVD) system 10 that incorporates a source plasma system according to embodiments of the invention. System 10 includes a chamber 13, a vacuum system 70, a source plasma system 80A, a bias plasma system 80B, a gas delivery system 33, and a remote plasma cleaning system 50.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support member 18.

A heater 23B is thermally coupled to the sidewall of dome 14. The heater includes an upper heating element and lower heating element, between which are positioned the RF side coils 30 around the dome 14. Perdendicular posts (not shown) may be coupled to the upper and lower heating elements of the heater 23B. Cooling of the dome 14 may be provided by the RF side coils 30 which can circulate cooling fluid (e.g., water) to reduce the temperature of the dome and generated plasma. System 10 may also include a top heater plate 23A coupled to the top portion of dome 14, as well as a cold plate 24. The heating and cooling elements allow optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 13 includes a body member 22, which joins the chamber to the vacuum system. A base portion 21 of substrate support member 18 is mounted on, and forms a continuous inner surface with, body member 22. Substrates are transferred into and out of chamber 13 by a robot blade (not shown) through an insertion/removal opening (not shown) in the side of chamber 13. Lift pins (shown in FIG. 2) are raised and then lowered under the control of a motor (not shown) to move the substrate to different positions within the chamber 13. The lift pins may be configured to move the substrate from the robot blade at an upper loading position 57 to a pre-processing position where, as explained further below, the substrate is prepared for processing. Subsequently, the lift pins may move the substrate to a lower processing position 56 in which the substrate is placed on a substrate receiving portion 19 of substrate support member

18. Substrate receiving portion 19 includes an electrostatic chuck 20 that secures the substrate to substrate support member 18 during substrate processing. In a preferred embodiment, substrate support member 18 is made from an aluminum oxide or aluminum ceramic material.

Vacuum system 70 includes throttle body 25, which houses twin-blade throttle valve 26 and is attached to gate valve 27 and turbo-molecular pump 28. It should be noted that throttle body 25 offers minimum obstruction to gas flow, and allows symmetric pumping. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures from between about 1 millitorr to about 2 torr.

The source plasma system 80A includes a top RF coil 29 mounted on dome 14, and side RF coils 30, mounted around the dome 14. A Faraday shield (not shown) may be provided between the top and side coils 29, 30 and dome 14. Top coil 29 is powered by top source RF (SRF) source 31A, and side coils 30 are powered by side SRF source 31B, allowing independent power levels and frequencies of operation for each coil. The dual coil system provides increased control of the radial ion density in chamber 13, which improves plasma uniformity. Side coils 30 and top coil 29 may be inductively driven, eliminating the requirement for a complimentary electrode. The top source RF supply 31A may provide up to 5,000 watts of RF power at nominally 2 MHz and the side source RF supply 31B may provide up to 5,000 watts of RF power at nominally 2 MHz. The operating frequencies of the top and side RF supplies may be offset from the nominal operating frequency (e.g., to 1.7-1.9 MHz and 1.9-2.1 MHz, respectively) to improve plasma-generation efficiency.

A bias plasma system 80B includes a bias RF ("BRF") supply 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF supplies 31A and 31B include digitally controlled synthesizers and operate over a frequency range between about 1.8 to about 2.1 MHz. Each supply includes a RF control circuit (not shown) that measures reflected power from the chamber and coil back to the supply and adjusts the frequency of operation to obtain the lowest reflected power, as understood by a person of ordinary skill in the art. RF supplies are typically designed to operate into a load with a characteristic impedance of 50 ohms. RF power may be reflected from loads that have a different characteristic impedance than the supply. This can reduce power transferred to the load. Additionally, power reflected from the load back to the supply may overload and damage the supply. Because the impedance of a plasma may range from less than 5 ohms to over 900 ohms, depending on the plasma ion density, among other factors, and because reflected power may be a function of frequency, adjusting the supply frequency according to the reflected power increases the power transferred from the RF supply to the plasma and protects the supply. Another way to reduce reflected power and improve efficiency is with a matching network.

Matching networks 32A and 32B match the output impedance of supplies 31A and 31B with their respective coils 29 and 30. The RF control circuit may tune both matching networks by changing the value of capacitors within the matching networks to match the supply to the load as the load changes. The RF control circuit may tune a matching network when the power reflected from the load back to the supply exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the supply output power to keep the delivered power substantially constant during deposition of a layer.

Figure 5B:
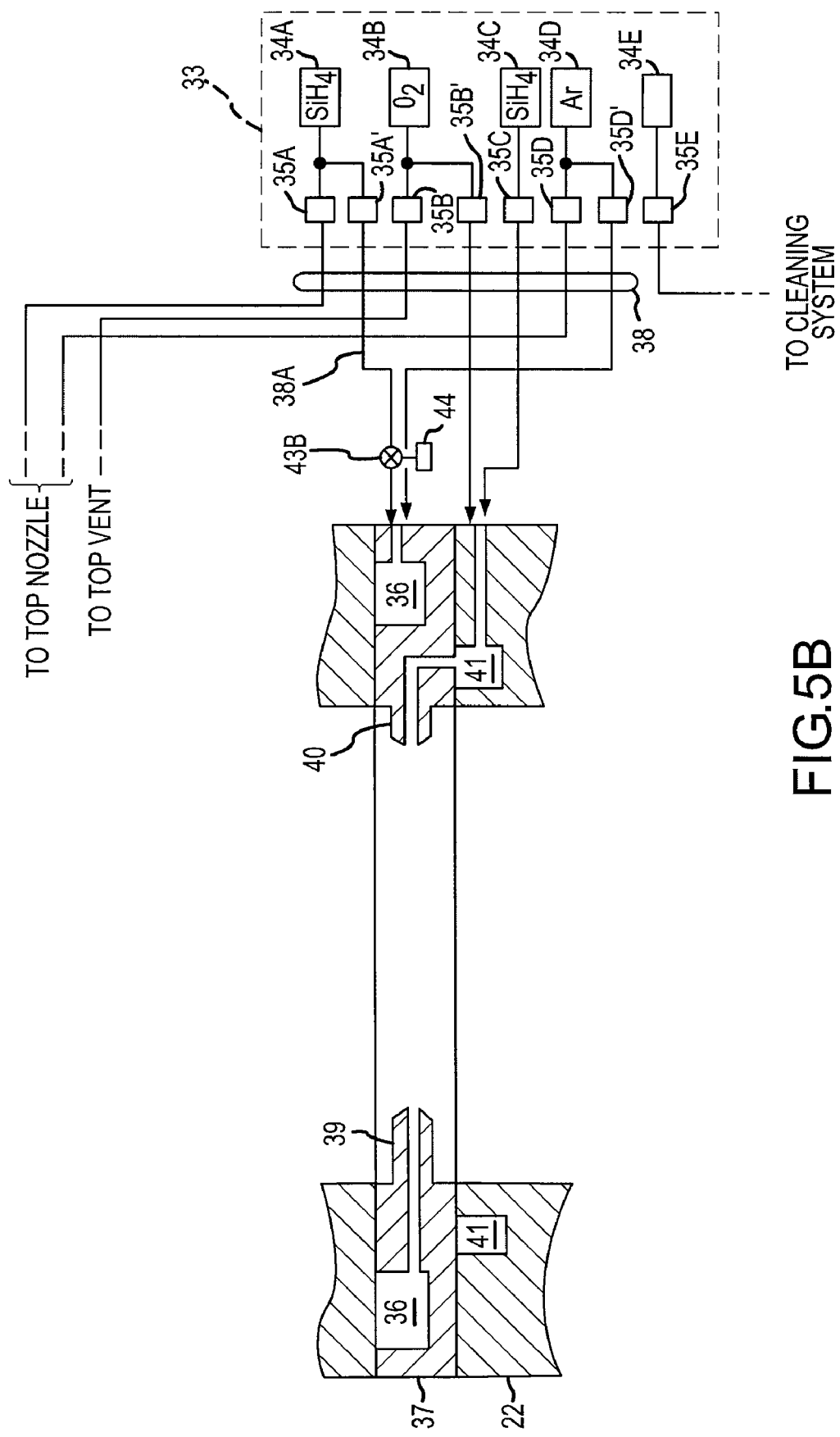

A gas delivery system 33 provides gases from several sources, 34A-34F chamber for processing the substrate via gas delivery lines 38 (only some of which are shown). As would be understood by a person of skill in the art, the actual sources used for sources 34A-34F and the actual connection of delivery lines 38 to chamber 13 varies depending on the deposition and cleaning processes executed within chamber 13. Gases are introduced into chamber 13 through a gas ring 37 and/or a top nozzle 45. FIG. 5B is a simplified, partial cross-sectional view of chamber 13 showing additional details of gas ring 37.

In one embodiment, first and second gas sources, 34A and 34B, and first and second gas flow controllers, 35A' and 35B', provide gas to ring plenum 36 in gas ring 37 via gas delivery lines 38 (only some of which are shown). Gas ring 37 has a plurality of source gas nozzles 39 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 37 has 12 source gas nozzles made from an aluminum oxide ceramic.

Gas ring 37 also has a plurality of oxidizer gas nozzles 40 (only one of which is shown), which in a preferred embodiment are co-planar with and shorter than source gas nozzles 39, and in one embodiment receive gas from body plenum 41. In some embodiments it is desirable not to mix source gases and oxidizer gases before injecting the gases into chamber 13. In other embodiments, oxidizer gas and source gas may be mixed prior to injecting the gases into chamber 13 by providing apertures (not shown) between body plenum 41 and gas ring plenum 36. In one embodiment, third and fourth gas sources, 34C and 34D, and third and fourth gas flow controllers, 35C and 35D', provide gas to body plenum via gas delivery lines 38. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 43B, to isolate chamber 13 from delivery line 38A and to vent delivery line 38A to vacuum foreline 44, for example. As shown in FIG. 5A, other similar valves, such as 43A and 43C, may be incorporated on other gas delivery lines. Such 3-way valves may be placed as close to chamber 13 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 5A, chamber 13 also has top nozzle 45 and top vent 46. Top nozzle 45 and top vent 46 allow independent control of top and side flows of the gases, which improves layer uniformity and allows fine adjustment of the layer's deposition and doping parameters. Top vent 46 is an annular opening around top nozzle 45. In one embodiment, first gas source 34A supplies source gas nozzles 39 and top nozzle 45. Source nozzle MFC 35A' controls the amount of gas delivered to source gas nozzles 39 and top nozzle MFC 35A controls the amount of gas delivered to top gas nozzle 45. Similarly, two MFCs 35B and 35B' may be used to control the flow of oxygen to both top vent 46 and oxidizer gas nozzles 40 from a single source of oxygen, such as source 34B. The gases supplied to top nozzle 45 and top vent 46 may be kept separate prior to flowing the gases into chamber 13, or the gases may be mixed in top plenum 48 before they flow into chamber 13. Separate sources of the same gas may be used to supply various portions of the chamber.

A remote microwave-generated plasma cleaning system 50 is provided to periodically clean deposition residues from chamber components. The cleaning system includes a remote microwave generator 51 that creates a plasma from a cleaning gas source 34E (e.g., molecular fluorine, nitrogen trifluoride, other fluorocarbons or equivalents) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process. In one embodiment, this cleaning system is used to dissociate atoms of the etchant gas remotely, which are then supplied to the process chamber 13. In another embodiment, the etchant gas is provided directly to the process chamber 13. In still a further embodiment, multiple process chambers are used, with deposition and etching steps being performed in separate chambers. In the present invention, cleaning times may be shortened (or better cleaning may be achieved if keeping the same cleaning time) because of less deposit on dome due to lower E field on side wall.

System controller 60 controls the operation of system 10. In a preferred embodiment, controller 60 includes a memory 62, such as a hard disk drive, a floppy disk drive (not shown), and a card rack (not shown) coupled to a processor 61. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 31 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT"), and a light pen.

While the above is a complete description of specific embodiments of the present invention, various modifications, variations, and alternatives may be employed. These equivalents and alternatives are included within the scope of the present invention. Therefore, the scope of this invention is not limited to the embodiments described, but is defined by the following claims and their full scope of equivalents.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

As used herein and in the appended claims, the singular forms "a", "and", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

What is claimed is:

1. A RF plasma generation and temperature control system for an inductively coupled plasma process chamber, the plasma generation system comprising:
   a heater comprising an elongated upper heating element substantially parallel to an elongated lower heating element, wherein the upper and lower heating elements are joined by one or more posts substantially perpendicular to the upper and lower heating elements; and
   one or more RF coils positioned between the upper and lower heating elements and featuring a crease at points of overlap with the posts.

2. The RF plasma generation system of claim 1, wherein the RF coils comprise rectangularly shaped hollow tubes.

3. The RF plasma generation system of claim 1, the RF coils comprise "D"-shaped hollow tubes, wherein a flat side of the tubes faces the chamber, and a curved side of the tubes faces away from the chamber.

4. The RF plasma generation system of claim 1, wherein each of the RF coils is hollow and can circulate a cooling fluid inside the coil.

5. The RF plasma generation system of claim 4, wherein the cooling fluid is water.

6. The RF plasma generation system of claim 1, wherein the RF coils are coupled to the posts with a spacer comprising an elastomeric material or energy absorbing plastic.

7. The RF plasma generation system of claim 1, wherein each of the RF coils comprises a plurality of turns.

8. The RF plasma generation system of claim 7, wherein each of the turns is a discontinuous loop having a break between a first end and a second end.

9. The RF plasma generation system of claim 8, wherein the first end of a first turn is electrically coupled to a RF feed input, and the second end of a last turn is electrically coupled to a RF feed output.

10. The RF plasma generation system of claim 8, wherein the second end of the first turn is electrically coupled to the first end of an adjacent turn.

11. The RF plasma generation system of claim 8, wherein the first end of each turn is coupled to an input for a cooling fluid and the second end of each turn is coupled to an output for the cooling fluid.

12. The RF plasma generation system of claim 1, wherein the elongated upper heating element is broken into a plurality of upper element segments, and each of the upper element segments is coupled to one of the posts.

13. The RF plasma generation system of claim 12, wherein the elongated lower heating element comprises a single lower element segment having a single break between a first end and a second end.

14. The RF plasma generation system of claim 12, wherein the elongated lower heating element is broken into a plurality of lower element segments, and each of the lower element segments is coupled to one of the posts.

15. The RF plasma generation system of claim 1, wherein the heater is electrically grounded.

16. A RF plasma generation and temperature control system for an inductively coupled plasma process chamber, the plasma generation system comprising:
a heater thermally coupled to the chamber, wherein the heater comprises an upper heating element and a lower heating element, and wherein the upper and lower heating elements are joined by one or more posts perpendicular to the upper and lower heating elements, said posts having a chamber side facing the chamber, and a coil side opposite the chamber side; and
a RF coil coupled to the chamber, wherein the RF coil comprises a hollow tube having at least one flat side, and wherein the coil has a crease at points of overlap with the posts.

17. The RF plasma generation system of claim 16, wherein the hollow tube is a rectangularly shaped hollow tube.

18. The RF plasma generation system of claim 16, wherein the hollow tube is a "D"-shaped hollow tube.

19. The RF plasma generation system of claim 16, wherein the hollow tube can circulate a cooling fluid inside the RF coil.

20. The RF plasma generating system of claim 16, wherein the RF coil is physically coupled to at least one of the posts with a spacer comprising an elastomeric material or energy absorbing plastic.

21. A RF plasma generation and temperature control system for an inductively coupled plasma process chamber, the plasma generation system comprising:
a heater comprising an elongated upper heating element substantially parallel to an elongated lower heating element, wherein the upper and lower heating elements are joined by one or more posts substantially perpendicular to the upper and lower heating elements; and
at least one RF coil positioned between the upper and lower heating elements and featuring a crease at points of overlap with the posts, wherein at least one non-creased portion of the RF coil makes physical contact with the process chamber.

22. The RF plasma generation system of claim 21, wherein the RF coil comprises a hollow tube having at least one flat side.

23. The RF plasma generation system of claim 22, wherein the hollow tube is a rectangularly shaped hollow tube.

24. The RF plasma generation system of claim 22, wherein the hollow tube is a "D"-shaped hollow tube.

25. The RF plasma generation system of claim 22, wherein the hollow tube can circulate a cooling fluid inside the RF coil.

26. The RF plasma generation system of claim 21, wherein all the non-creased portions of the RF coil make physical contact with the process chamber.

27. The RF plasma generating system of claim 21, wherein the RF coil is physically coupled to at least one of the posts with a spacer comprising an elastomeric material or energy absorbing plastic.

* * * * *

UNITED STATES PATENT AND TRADEMARK OFFICE
CERTIFICATE OF CORRECTION

| | | |
|---|---|---|
| PATENT NO. | : 7,776,156 B2 | Page 1 of 1 |
| APPLICATION NO. | : 11/055191 | |
| DATED | : August 17, 2010 | |
| INVENTOR(S) | : Maolin Long | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1245 days.

Signed and Sealed this
Twelfth Day of July, 2011

David J. Kappos
*Director of the United States Patent and Trademark Office*